(12) United States Patent
Zhang et al.

(10) Patent No.: US 11,482,628 B2
(45) Date of Patent: Oct. 25, 2022

(54) DOUBLE SCHOTTKY-BARRIER DIODE

(71) Applicant: University of Electronic Science and Technology of China, Chengdu (CN)

(72) Inventors: Yong Zhang, Chengdu (CN); Chengkai Wu, Chengdu (CN); Han Wang, Chengdu (CN); Haomiao Wei, Chengdu (CN); Ruimin Xu, Chengdu (CN); Bo Yan, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 17/078,109

(22) Filed: Oct. 23, 2020

(65) Prior Publication Data
US 2021/0217901 A1    Jul. 15, 2021

(30) Foreign Application Priority Data
Jan. 13, 2020    (CN) .......................... 202010030727.X

(51) Int. Cl.
*H01L 29/872* (2006.01)
*H01L 29/66* (2006.01)

(52) U.S. Cl.
CPC ...... *H01L 29/872* (2013.01); *H01L 29/66212* (2013.01)

(58) Field of Classification Search
None
See application file for complete search history.

(56) References Cited

U.S. PATENT DOCUMENTS 5,041,881 A * 8/1991 Bishop .................. H01L 24/05
257/472

FOREIGN PATENT DOCUMENTS

CN    204204868 U  *  3/2015

OTHER PUBLICATIONS

Translation of CN204204868U (Year: 2015).*

* cited by examiner

*Primary Examiner* — Xiaoming Liu
(74) *Attorney, Agent, or Firm* — Bayramoglu Law Offices LLC

(57) ABSTRACT

A double Schottky-barrier diode includes a semi-insulating substrate, a left mesa formed by growth and etching on the semi-insulating substrate, a middle mesa formed by growth and etching on the semi-insulating substrate, a right mesa formed by growth and etching on the semi-insulating substrate, two anode probes and two air-bridge fingers. The two Schottky contacts are closely fabricated on the same mesa (middle mesa) in a back-to-back manner to obtain even symmetric C-V characteristics and odd symmetric I-V characteristics from the device level. The output of a frequency multiplier fabricated using the double Schottky-barrier diode only has odd harmonics, but no even harmonics, which is suitable for the production of high-order frequency multipliers. The cathodes of the two Schottky contacts are connected by the buffer layer without ohmic contact.

7 Claims, 3 Drawing Sheets

DOUBLE SCHOTTKY-BARRIER DIODE

CROSS REFERENCE TO THE RELATED APPLICATIONS

This application is based upon and claims priority to Chinese Patent Application No. 202010030727.X, filed on Jan. 13, 2020, the entire contents of which are incorporated herein by reference.

TECHNICAL FIELD

The present invention relates to the technical field of frequency multiplier design, and in particular to a double Schottky-barrier diode.

BACKGROUND

Terahertz frequency is widely used in broadband communication, security imaging, radio astronomy, atmospheric observation, and the alike fields. At present, the development and utilization of terahertz technology urgently need efficient and stable room-temperature terahertz sources. In recent years, the development of transistor and monolithic microwave integrated circuit (MMIC) technologies enables the design of active frequency multipliers and amplifiers towards the submillimeter-wave regime. However, the output power of the active frequency multipliers and amplifiers decreases rapidly with an increase of frequency.

The Schottky diode is a two-terminal device and typically used in applications such as terahertz power generation and signal detection because of its simple structure and low parasitic parameters. The design of a Schottky diode-based frequency multiplier uses different diode configurations at the chip level, for example, uses multiple diodes in anti-series configuration or in a series configuration to form a balanced structure, which is conducive to simplify the circuit design and improve the spectral purity. These configurations are typically used for low-order frequency multipliers, i.e. doublers or triplers. The terahertz transceiver front-end, however, generally requires multiple-stage frequency multipliers to reach frequencies of above 1 THz. Therefore, it is highly desirable to develop high-order frequency multipliers, e.g., quintuplers and septuplers, to minimize the number of cascaded components. The current method adopts the connection of multiple diode dies in anti-series or in series. This method not only increases the extra ohmic contact loss (one Schottky contact corresponds to one ohmic contact), but also cannot obtain even symmetry Capacitance-Voltage (C-V) characteristics, making it difficult to be applied to high-order frequency multipliers.

SUMMARY

An objective of the present invention is to provide a double Schottky-barrier diode suitable for high-order frequency multipliers.

To achieve the above-mentioned objective, the present invention provides the following technical solution.

A double Schottky-barrier diode includes a semi-insulating substrate, a left mesa, a middle mesa and a right mesa formed by growth and etching on the semi-insulating substrate, two anode probes, and two air-bridge fingers.

The two anode probes respectively penetrate the passivation layer of the middle mesa, and contact the upper surface of the epitaxial layer of the middle mesa to form two Schottky contacts. The cathodes of the two Schottky contacts are connected through the buffer layer of the middle mesa. The anodes of the two Schottky contacts are respectively guided to the left mesa and the right mesa through the two air-bridge fingers, penetrate the passivation layer and the epitaxial layer of each of the left mesa and the right mesa, respectively, and contact the buffer layer of each of the left mesa and the right mesa to form two anode contacts. The anode of the Schottky contact is the anode probe, and the cathode of the Schottky contact is the lower surface of the epitaxial layer where the Schottky contact is located.

Optionally, each of the left mesa, the middle mesa and the right mesa successively includes the buffer layer, the epitaxial layer and the passivation layer from bottom to top.

Optionally, the buffer layer is heavily doped gallium arsenide.

Optionally, the epitaxial layer is lightly doped gallium arsenide.

Optionally, the material of the passivation layer is silicon dioxide.

Optionally, the material of the semi-insulating substrate is gallium arsenide.

Optionally, the air-bridge finger is an air-bridge structure.

A method for preparing a double Schottky-barrier diode includes the following steps:

growing a buffer layer, an epitaxial layer and a passivation layer on a semi-insulating substrate in sequence;

heavily doping the buffer layer and lightly doping the epitaxial layer;

etching the buffer layer, the epitaxial layer and the passivation layer to form a left mesa, a middle mesa and a right mesa independent of each other;

allowing first ends of two anode probes to penetrate the passivation layer of the middle mesa and contact the epitaxial layer of the middle mesa to form two Schottky contacts; and guiding second ends of the two anode probes to the left mesa and the right mesa through two air-bridge fingers, wherein the second ends of the two anode probes penetrate a passivation layer and an epitaxial layer of each of the left mesa and the right mesa, respectively, and contact a buffer layer of each of the left mesa and the right mesa to form two anode contacts.

According to a specific embodiment provided by the present invention, the present invention has the following technical effects and advantages.

The proposed double Schottky-barrier diode includes a semi-insulating substrate, a left mesa, a middle mesa and a right mesa formed by growth and etching on the semi-insulating substrate, two anode probes and two air-bridge fingers. The two anode probes respectively penetrate a passivation layer of the middle mesa, and contact an epitaxial layer of the middle mesa to form two Schottky contacts. The cathodes of the two Schottky contacts are connected through the buffer layer of the middle mesa. The anodes of the two Schottky contacts are respectively guided to the left mesa and the right mesa through the two air-bridge fingers, to penetrate the passivation layer and the epitaxial layer of each of the left mesa and the right mesa, respectively to form two anode contacts, so as to obtain an anti-series type double Schottky-barrier diode structure. The two Schottky contacts of the present invention are closely fabricated on the same mesa (middle mesa) in a back-to-back manner to obtain even symmetric C-V characteristics and odd symmetric current-bias (I-V) characteristics from the device level. The output of a frequency multiplier fabricated using the double Schottky-barrier diode only has odd harmonics, but no even harmonics, which is suitable for the production of high-order frequency multipliers. Moreover, the cathodes of the two Schottky contacts are connected by the buffer layer without ohmic contact, which reduces the series resistance of the devices and improves the frequency multiplication efficiency.

BRIEF DESCRIPTION OF THE DRAWINGS

In order to explain the embodiments of the present invention or the technical solutions in the prior art more clearly, the drawings used in the embodiments will be briefly introduced below. Obviously, the drawings described below are only some embodiments of the present invention. For ordinary artisans in the art, other drawings can be obtained according to these drawings without creative efforts.

DETAILED DESCRIPTION OF THE EMBODIMENTS

Hereinafter, the technical solutions in the embodiments of the present invention will be described clearly and completely in combination with the drawings in the embodiments of the present invention. Obviously, the described embodiments are only a part of the embodiments of the present invention, rather than all the embodiments. Based on the embodiments of the present invention, all other embodiments obtained by persons with ordinary skill in the art without creative efforts shall fall within the scope of protection of the present invention.

The objective of the present invention is to provide a double Schottky-barrier diode suitable for high-order frequency multipliers.

In order to make the above-mentioned objective, features, and advantages of the present invention more obvious and easy to understand, the present invention is further described in detail in combination with the drawings and specific embodiments.

Figure 1:
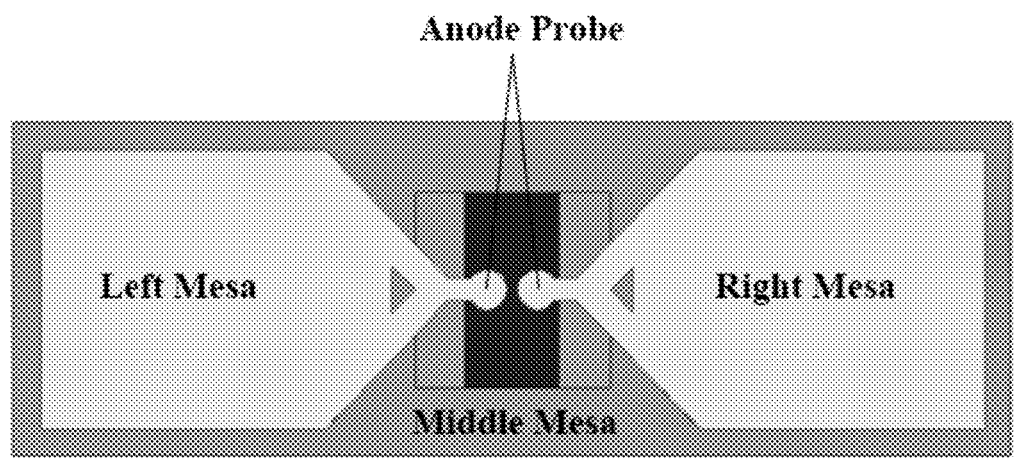
FIG. 1 is a schematic diagram showing the structure of the double Schottky-barrier diode provided by the present invention.
Figure 2:
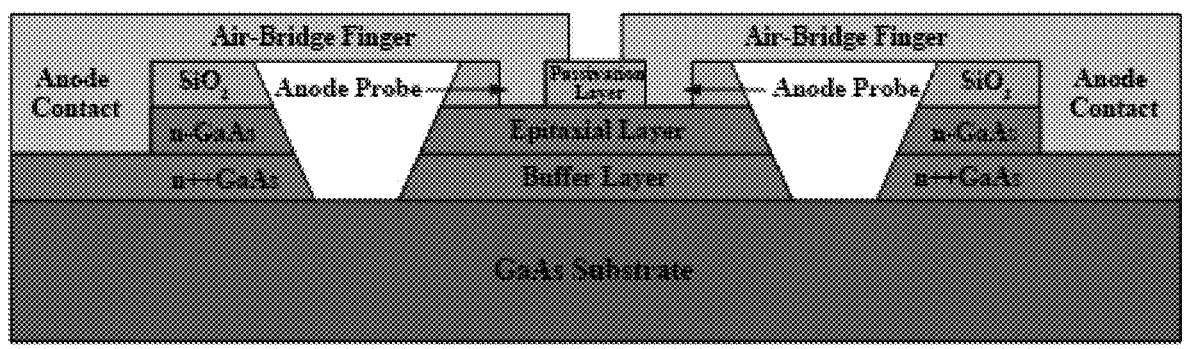
FIG. 2 is a schematic diagram showing a cross-sectional structure of the double Schottky-barrier diode provided by the present invention.

Present invention provides a double Schottky-barrier diode. As shown in FIGS. 1-2, the double Schottky-barrier diode includes a semi-insulating substrate, a left mesa, a middle mesa and a right mesa formed by growth and etching on the semi-insulating substrate, two anode probes and two air-bridge fingers. Each of the left mesa, the middle mesa and the right mesa successively includes a buffer layer, an epitaxial layer and a passivation layer from bottom to top. The two anode probes respectively penetrate the passivation layer of the middle mesa, and contact the upper surface of the epitaxial layer of the middle mesa to form two Schottky contacts. The cathodes of the two Schottky contacts are connected through the buffer layer of the middle mesa. The anodes of the two Schottky contacts are respectively guided to the left mesa and the right mesa through the two air-bridge fingers, penetrate the passivation layer and the epitaxial layer of each of the left mesa and the right mesa, respectively, and contact the buffer layer of each of the left mesa and the right mesa to form two anode contacts, so as to form a double Schottky-barrier diode with the two Schottky contacts connected in anti-series in a back-to-back manner, which has the equivalent circuit shown in FIG. 3. The anode of the Schottky contact is the anode probe, and the cathode of the Schottky contact is the lower surface of the epitaxial layer where the Schottky contact is located.

As shown in FIG. 2, the buffer layer is heavily doped gallium arsenide (n++GaAs). The epitaxial layer is lightly doped gallium arsenide (n-GaAs). The material of the semi-insulating substrate is gallium arsenide (GaAs). The air-bridge finger is an air-bridge structure, that is, the passivation layer, the epitaxial layer and the buffer layer under the air-bridge finger are etched. The doping concentration of heavy doping is on the order of $5\times10^{18}$ cm$^{-3}$, and the doping concentration of light doping is on the order of $2\times10^{17}$ cm$^{-3}$.

A method for preparing the double Schottky-barrier diode includes the following steps:

the buffer layer, the epitaxial layer and the passivation layer are grown on the semi-insulating substrate in sequence;

the buffer layer is heavily doped and the epitaxial layer is lightly doped;

the buffer layer, the epitaxial layer and the passivation layer are etched to form the left mesa, the middle mesa and the right mesa independent of each other;

the first ends of the two anode probes penetrate the passivation layer of the middle mesa, respectively, and contact the epitaxial layer of the middle mesa to form the two Schottky contacts; and the second ends of the two anode probes are respectively guided to the left mesa and the right mesa through the two air-bridge fingers, penetrate the passivation layer and the epitaxial layer of each of the left mesa and the right mesa, respectively, and contact the buffer layer of each of the left mesa and the right mesa to form two anode contacts.

Figure 4:
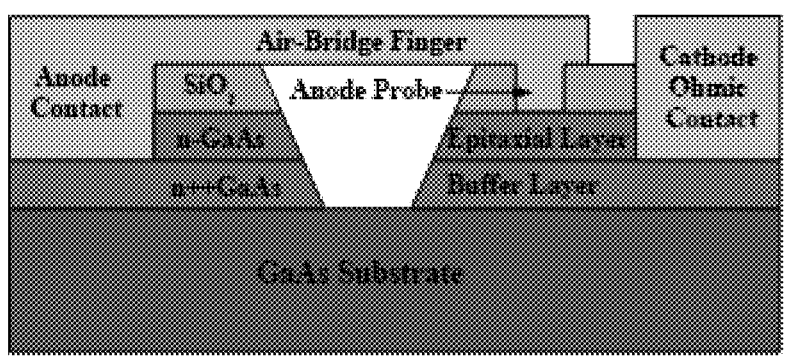
FIG. 4 is a schematic diagram showing a cross-sectional structure of a Schottky diode in the prior art according to the present invention.

The present invention uses Schottky contact and conduction characteristics of the buffer layer to realize symmetric C-V characteristics, forming a new device suitable for high-order frequency multiplication. Moreover, the double Schottky-barrier diode of the present invention is compatible with conventional planar Schottky diode technology (as shown in FIG. 2 and FIG. 4), that is, includes the substrate, the buffer layer, the epitaxial layer, the passivation layer and the air-bridge finger from bottom to top. The main contents of the present invention are as follows.

1) Two back-to-back anode probes are formed on the middle mesa.

2) The anode probes penetrate the passivation layer to the epitaxial layer and contacts the upper surface of the epitaxial layer to form Schottky contacts.

3) The cathodes of the two Schottky contacts are connected by the buffer layer.

4) The anode probe is guided to the left mesa and the right mesa through the air bridge (anode bridge) finger.

The present invention provides a double barrier diode structure, wherein the two Schottky contacts are fabricated on the middle mesa in a back-to-back manner. The cathodes of the Schottky contacts are connected through the buffer layer, and the anodes of the Schottky contacts are guided through the air-bridge finger, so as to obtain a diode topology structure in an anti-series type.

Figure 3:
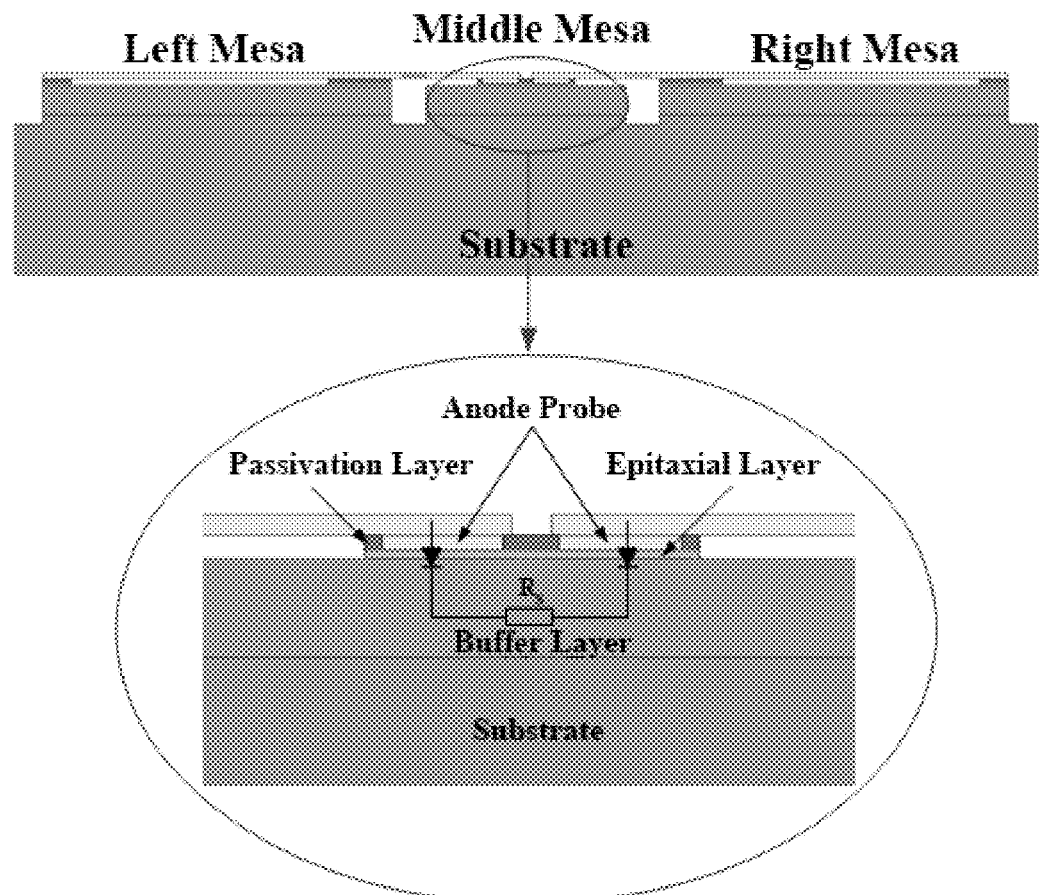
FIG. 3 is a schematic diagram showing an equivalent circuit of the cross-sectional structure of a double Schottky-barrier diode provided by the present invention.
Figure 5:
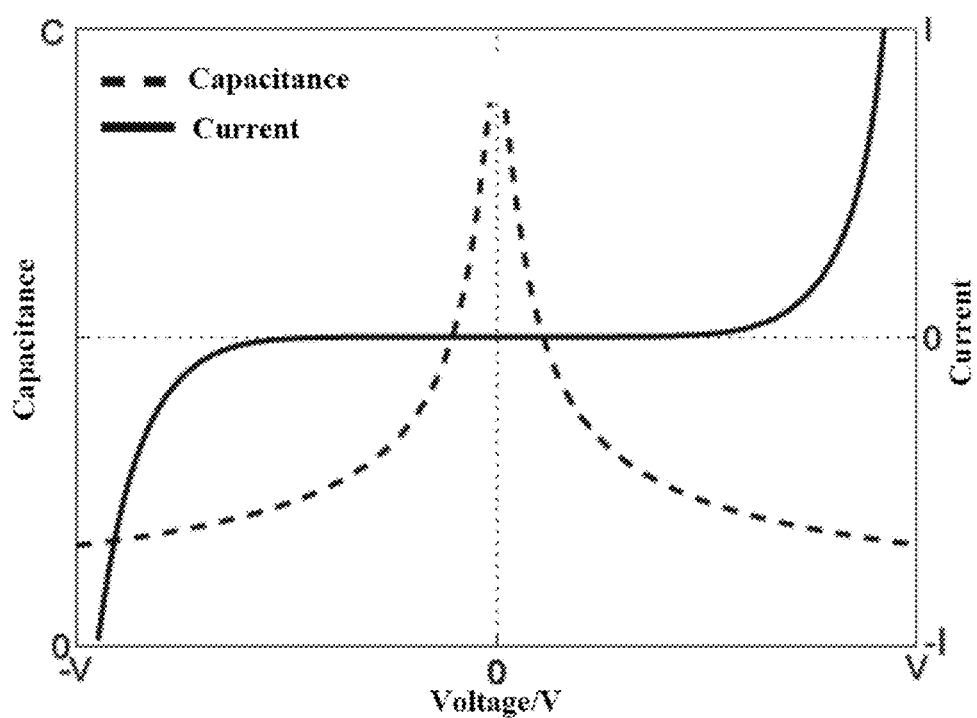
FIG. 5 is a schematic diagram showing characteristic curves of the double Schottky-barrier diode provided by the present invention, wherein the solid line represents a C-V characteristic curve, and the dashed line represents an I-V characteristic curve.

The advantages of the present invention are as follows. An anti-series type double barrier diode structure is formed at the device level by using the highly-conductive characteristic of the buffer layer and a back-to-back structure of the anode, as shown in FIG. 3. FIG. 5 shows the C-V (Capacitance (unit fF)-Voltage (unit V)) characteristic curve and the I-V (Current (unit fA)-Voltage (unit V)) characteristic curve of the double barrier diode of the present invention. The output of a frequency multiplier fabricated by using the double barrier diode only has odd harmonics and no even harmonics. Moreover, since the cathodes of the two Schottky barriers are directly connected through the buffer layer, the ohmic contact can be eliminated, which reduces the series resistance of the devices and improves the frequency multiplication efficiency. In this way, the fabrication process is simplified, and the area of the core area of the diode is minimized, which is conducive to the fabrication of multi-finger structures to increase the power capacity. The double Schottky-barrier diode of the present invention has a simple structure and is fully compatible with the conventional diode technology, which is conducive to simplifying the design of frequency multipliers, and exhibits good practicability in the design of high-order frequency multipliers in the terahertz band.

Herein, the equivalent embodiments are described in a progressive manner. Each embodiment focuses on the differences with other embodiments. The same or similar parts between the equivalent embodiments can be referred to each other.

Herein, the specific examples are used to explain the principle and implementation mode of the present invention. The description of the above embodiments is only used to facilitate understanding the method and core idea of the present invention. The described embodiments are only a part of the embodiment of the present invention, rather than all the embodiments. Based on the embodiments of the present invention, all other embodiments obtained by ordinary artisans in the art without creative efforts shall fall within the scope of protection of the invention.

What is claimed is:

1. A double Schottky-barrier diode, comprising a semi-insulating substrate, a left mesa formed by growth and etching on the semi-insulating substrate, a middle mesa formed by growth and etching on the semi-insulating substrate, a right mesa formed by growth and etching on the semi-insulating substrate, two anode probes and two air-bridge fingers; wherein the two anode probes respectively penetrate a passivation layer of the middle mesa to contact an upper surface of an epitaxial layer of the middle mesa to form two Schottky contacts;

cathodes of the two Schottky contacts are connected through a buffer layer of the middle mesa;

anodes of the two Schottky contacts are respectively guided to the left mesa and the right mesa through the two air-bridge fingers, penetrate the passivation layer and the epitaxial layer of each of the left mesa and the right mesa, respectively, and contact the buffer layer of each of the left mesa and the right mesa to form two anode contacts; and the anodes of the two Schottky contacts are the two anode probes, and the cathodes of the two Schottky contacts are a lower surface of the epitaxial layer, wherein the two Schottky contacts are located on the upper surface of the epitaxial layer, wherein, each of the left mesa, the middle mesa and the right mesa comprises the buffer layer, the epitaxial layer and the passivation layer, and the buffer layer, the epitaxial layer and the passivation layer are arranged successively from bottom to top;

wherein the two Schottky contacts are connected in anti-series in a back-to-back manner.

2. The double Schottky-barrier diode according to claim 1, wherein the buffer layer is heavily doped gallium arsenide.

3. The double Schottky-barrier diode according to claim 1, wherein the epitaxial layer is lightly doped gallium arsenide.

4. The double Schottky-barrier diode according to claim 1, wherein a material of the passivation layer is silicon dioxide.

5. The double Schottky-barrier diode according to claim 1, wherein a material of the semi-insulating substrate is gallium arsenide.

6. The double Schottky-barrier diode according to claim 1, wherein each of the two air-bridge fingers is an air bridge structure.

7. A method for preparing a double Schottky-barrier diode, comprising the following steps:

growing a buffer layer, an epitaxial layer and a passivation layer on a semi-insulating substrate in sequence;

heavily doping the buffer layer and lightly doping the epitaxial layer;

etching the buffer layer, the epitaxial layer and the passivation layer to form a left mesa, a middle mesa, and a right mesa independent of each other;

allowing first ends of two anode probes to penetrate the passivation layer of the middle mesa, respectively, and contact the epitaxial layer of the middle mesa to form two Schottky contacts;

guiding second ends of the two anode probes to the left mesa and the right mesa through two air-bridge fingers, wherein the second ends of the two anode probes penetrate the passivation layer and the epitaxial layer of each of the left mesa and the right mesa, respectively, and contact the buffer layer of each of the left mesa and the right mesa to form two anode contacts;

wherein the two Schottky contacts are fabricated on the middle mesa in a back-to-back manner.

* * * * *